(12) United States Patent
Oh et al.

(10) Patent No.: US 8,269,412 B2
(45) Date of Patent: Sep. 18, 2012

(54) ORGANIC ELECTROLUMINESCENT DISPLAY DEVICE AND METHOD OF FABRICATING THE SAME

(75) Inventors: Jae-Young Oh, Seoul (KR); Dong-Su Shin, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 691 days.

(21) Appl. No.: 12/003,625

(22) Filed: Dec. 28, 2007

(65) Prior Publication Data

US 2008/0238831 A1    Oct. 2, 2008

(30) Foreign Application Priority Data

Mar. 26, 2007 (KR) .................. 10-2007-0029092

(51) Int. Cl.
*H01J 1/62*    (2006.01)
*H01J 63/04*   (2006.01)
*H01L 51/00*   (2006.01)

(52) U.S. Cl. ....................... 313/504; 313/503
(58) Field of Classification Search ........... 313/503–504
See application file for complete search history.

(56) References Cited

U.S. PATENT DOCUMENTS

| | | | |
|---|---|---|---|
| 2003/0197181 A1* | 10/2003 | Yun ................................ | 257/72 |
| 2005/0062407 A1* | 3/2005 | Suh et al. ....................... | 313/504 |
| 2006/0181221 A1* | 8/2006 | Sato ............................. | 315/169.3 |
| 2006/0186825 A1* | 8/2006 | Nakanishi ...................... | 315/169.3 |
| 2006/0208971 A1* | 9/2006 | Deane ............................. | 345/76 |
| 2006/0214564 A1* | 9/2006 | Chang .......................... | 313/504 |
| 2007/0114918 A1* | 5/2007 | Arai et al. ..................... | 313/504 |
| 2008/0012481 A1* | 1/2008 | Park et al. ..................... | 313/506 |

OTHER PUBLICATIONS

Taiwan Office Action dated Nov. 21, 2011, with English translation.
U.S. Office Action dated Nov. 26, 2010.

* cited by examiner

*Primary Examiner* — Karabi Guharay
*Assistant Examiner* — Michael Santonocito
(74) *Attorney, Agent, or Firm* — Morgan, Lewis & Bockius LLP

(57) ABSTRACT

An organic electroluminescent display device includes: a substrate; a gate line, a data line and a power line on the substrate; a switching element connected to the gate line and the data line; a driving element connected to the switching element, the driving element including a driving drain electrode; a first passivation layer on the switching element and the driving element, the first passivation layer having a first contact hole exposing the driving drain electrode; a first shield pattern under the first contact hole, the first shield pattern including a same material and a same layer as the gate line; a first electrode on the first passivation layer, the first electrode connected to the driving drain electrode through the first contact hole; an organic electroluminescent layer on the first electrode; and a second electrode on the organic electroluminescent layer.

23 Claims, 16 Drawing Sheets

ORGANIC ELECTROLUMINESCENT DISPLAY DEVICE AND METHOD OF FABRICATING THE SAME

The present application claims the benefit of Korean Patent Application No. 10-2007-0029092 filed in Korea on Mar. 26, 2007, which is hereby incorporated by reference in its entirety.

BACKGROUND OF THE INVENTION

1. Field of the Invention

The present invention relates to an organic electroluminescent display (ELD) device, and more particularly, to an array substrate for an organic electroluminescent display device and a method of fabricating the same.

2. Discussion of the Related Art

An organic electroluminescent display (ELD) device, which is a type of flat panel display, is a self-emission type display. In general, the organic ELD device emits light by injecting electrons from a cathode and holes from an anode into an emission layer, combining the electrons with the holes, generating an exciton, and transitioning the exciton from an excited state to a ground state. Accordingly, the organic ELD device does not require an additional light source and has a light weight, thin profile, and compact size.

There are two types of organic ELD devices: passive matrix type and active matrix type. While both the passive matrix organic ELD device and the active matrix organic ELD device have simple structures and are formed by a simple fabricating process, the passive matrix organic ELD device requires a relatively high amount of power to operate. In addition, the display size of a passive matrix organic ELD device is limited by its structure. Furthermore, as the number of conductive lines increases, the aperture ratio of a passive matrix organic ELD device decreases. In contrast, active matrix organic ELD devices are highly efficient and can produce a high-quality image for a large display with a relatively low power.

FIG. 1 is a cross-sectional view of a bottom emission type organic electroluminescent display device according to the related art. In FIG. 1, an organic ELD device 1 includes first and second substrates 10 and 5 attached to each other by a sealant 15 with a space therebetween. An array element layer 14 including a thin film transistor (TFT) T is formed on the first substrate 10. In addition, a first electrode 70, an organic electroluminescent (EL) layer 85 and a second electrode 90 are sequentially formed on the array element layer 14. The first electrode 70 is formed in each pixel region P, and the organic EL layer 85 separately displays red, green, and blue colors in each pixel region P. The organic EL layer 85 for different colors may be formed of different materials corresponding to the colors.

The organic ELD device 1 is encapsulated by attaching the first substrate 10 and the second substrate 5 with the sealant 15. The second substrate 5 includes a moisture absorbent material 9 to eliminate moisture and oxygen that may penetrate into the organic EL layer 85. After etching a portion of the second substrate 5, the etched portion is filled with the absorbent material 9 and the filled absorbent material 9 is fixed with a tape 7. Since the first electrode 70 is formed of a transparent conductive material, light from the organic EL layer 85 is emitted at a bottom of the organic ELD device 1 through the first electrode 70.

FIG. 2 is a plane view an array substrate for an organic electroluminescent display device according to the related art. In FIG. 2, a gate line 20, a data line 30 and a power line 31 are formed on a substrate 10. The gate line 20 crosses the data line 30 to define a pixel region P, and the power line 31 is parallel to and spaced apart from the data line 30. A switching element Ts is connected to the gate line 20 and the data line 30, and a driving element Td is connected to the switching element Ts. The switching element Ts includes a first gate electrode 25, a first active layer 40a, a first ohmic contact layer (not shown), a first source electrode 32a and a first drain electrode 34a. In addition, the driving element Td includes a second gate electrode 26, a second active layer 40b, a second ohmic contact layer (not shown), a second source electrode 32b and a second drain electrode 34b. Portions of the data line 30 and the power line 31 may be used as the first and second source electrodes 32a and 32b, respectively. A transparent first electrode 70 in the pixel region P is connected to the second drain electrode 34b through a first contact hole CH1. Further, a transparent connection line 75 is connected to the first drain electrode 34a through a second contact hole CH2 and the second gate electrode 26 through a third contact hole CH3, thereby connecting the first drain electrode 34a and the second gate electrode 26.

FIG. 3 is a cross-sectional view taken along a line III-III of FIG. 2. In FIG. 3, a gate insulating layer 45 is formed on the second gate electrode 26. The second active layer 40b and the second ohmic contact layer 41b are sequentially formed on the gate insulating layer 45, and the second source and drain electrodes 32b and 34b are formed on the second ohmic contact layer 41b. The second source and drain electrodes 32b and 34b are spaced apart from each other, and the second active layer 40b is exposed through a space between the second source and drain electrodes 32b and 34b.

A first passivation layer 65 having the first contact hole CH1 is formed on the second source and drain electrodes 32b and 34b, and a color filter layer 78 is formed on the first passivation layer 65. Although not shown in FIG. 3, the color filter layer 78 includes red, green and blue color filters each corresponding to the pixel region P (of FIG. 2). The transparent first electrode 70 connected to second drain electrode 34b is formed on the color filter layer 78, and a second passivation layer 66 is formed on the first electrode 70. The second passivation layer 66 has a fourth contact hole CH4 exposing the first electrode 70 corresponding to the first contact hole CH1. The organic EL layer 85 is formed on the first electrode 70, and the second electrode 90 is formed on the organic EL layer 85.

The second source and drain electrodes 32b and 34b and the data line 30 are formed of a metallic material, for example, molybdenum (Mo). While the first passivation layer 65 is patterned to form the first contact hole CH1, the second drain electrode 34b corresponding to the first contact hole CH1 is also removed. Accordingly, the first electrode 70 contacts side surfaces of the second drain electrode 34b and the substrate 10 corresponding to the first contact hole CH1. As a result, the light from the organic EL layer 85 corresponding to the first contact hole CH1 is emitted through the first electrode 70. Since the light corresponding to the first contact hole CH1 does not pass through the color filter layer 78, the light corresponding to the first contact hole CH1 causes a light leakage. In addition, the second drain electrode 34b may be over-etched to form an overhang structure where the second drain electrode 34b is not exposed through the first contact hole CH1, or the gate insulating layer may be etched to generate step differences on side surfaces of the first contact hole CH1. Accordingly, when the first electrode 70 is formed on the first passivation layer 65, the first electrode 70 may not contact the second drain electrode 34b because of the overhang structure or may be broken to cause an electric opening between the switching element Ts and the driving element Td.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic electroluminescent display device having an improved display quality by preventing light leakage at a contact hole.

Another object of the present invention is to provide an organic electroluminescent display device having a reliable contact property due to a shield pattern.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes: a substrate; a gate line, a data line, and a power line on the substrate, the gate line and the data line crossing each other to define a pixel region, the power line parallel to and spaced apart from the data line; a switching element connected to the gate line and the data line, the switching element including a switching gate electrode, a switching active layer, a switching source electrode and a switching drain electrode; a driving element connected to the switching element, the driving element including a driving gate electrode, a driving active layer, a driving source electrode and a driving drain electrode; a first passivation layer on the switching element and the driving element, the first passivation layer having a first contact hole exposing the driving drain electrode; a first shield pattern under the first contact hole, the first shield pattern including a same material and a same layer as the gate line; a first electrode on the first passivation layer, the first electrode connected to the driving drain electrode through the first contact hole; an organic electroluminescent layer on the first electrode; and a second electrode on the organic electroluminescent layer.

In another aspect, a method of fabricating an organic electroluminescent display device includes: forming a gate line, a switching gate electrode, a driving gate electrode and a first shield pattern on a substrate, the switching gate electrode connected to the gate line; forming a gate insulating layer on the gate line, the switching gate electrode, the driving gate electrode and the first shield pattern; forming a switching active layer and a driving active layer on the gate insulating layer, the switching active layer and the driving active layer corresponding to the switching gate electrode and the driving gate electrode, respectively; forming a switching source electrode and a switching drain electrode on the switching active layer, a driving source electrode and a driving drain electrode on the driving active layer, and a data line on the gate insulating layer, the data line crossing the gate line to define a pixel region; forming a first passivation layer on the switching source electrode, the switching drain electrode, the driving source electrode, the driving drain electrode and the data line, the first passivation layer having a first contact hole exposing the driving drain electrode, the first contact hole disposed over the first shield pattern; forming a first electrode over the first passivation layer, the first electrode connected to the driving drain electrode through the first contact hole; forming an organic electroluminescent layer on the first electrode; and forming a second electrode on the organic electroluminescent layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
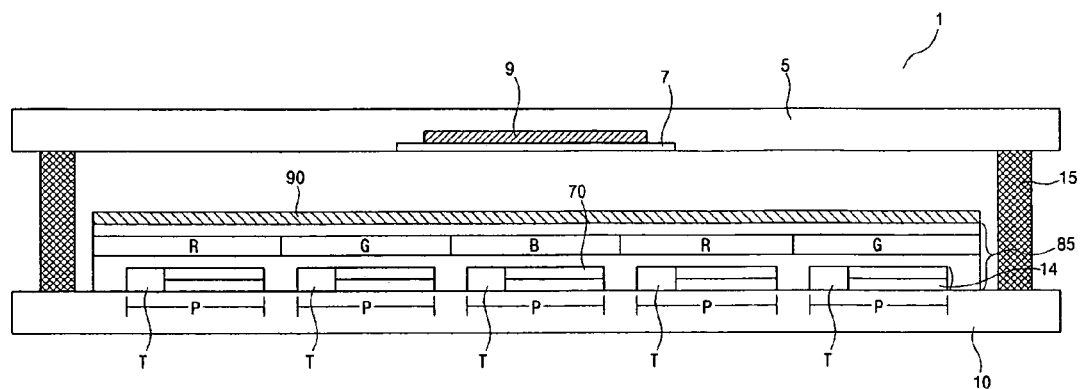
FIG. 1 is a cross-sectional view of a bottom emission type organic electroluminescent display device according to the related art.
Figure 2:
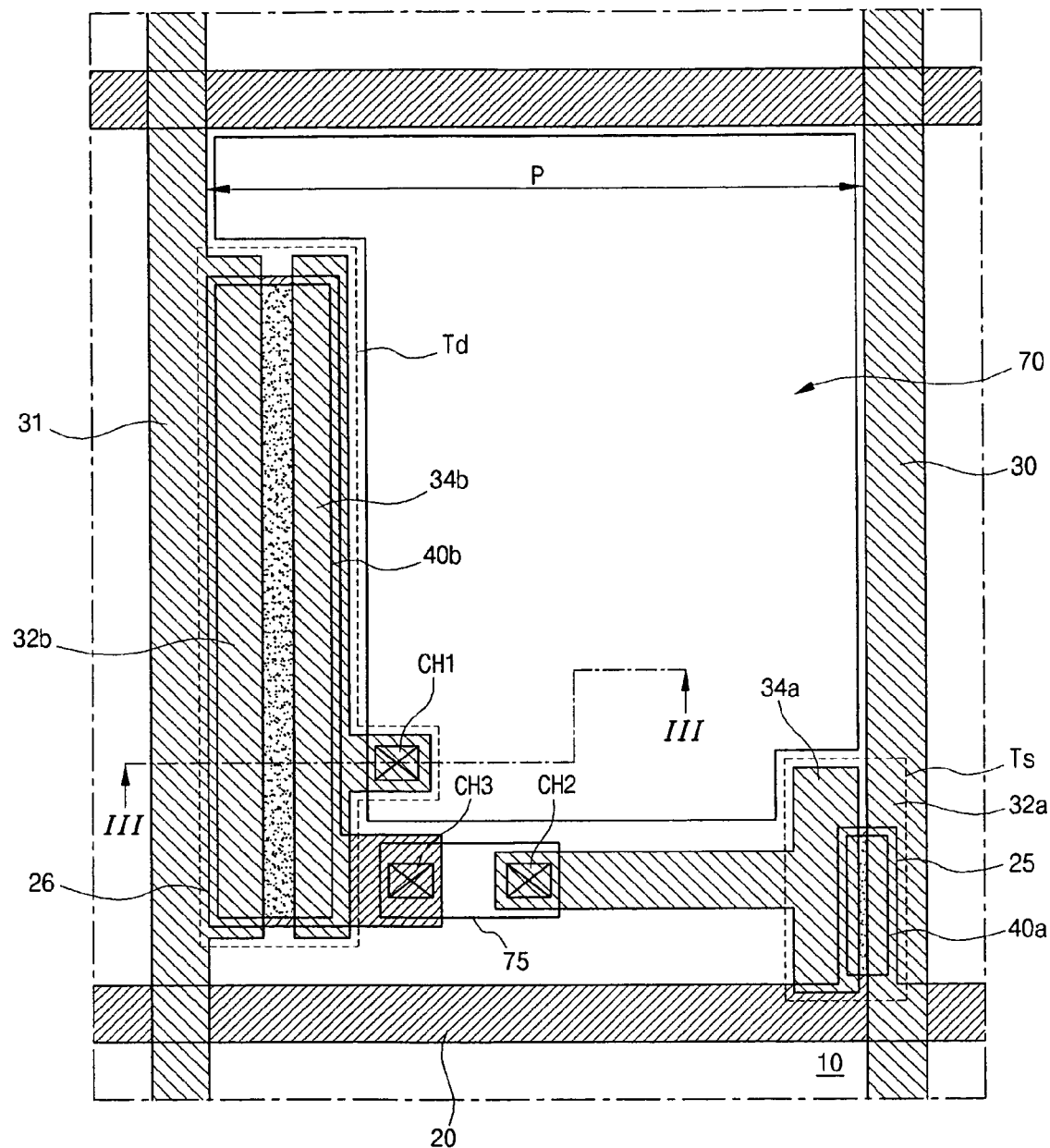
FIG. 2 is a plane view an array substrate for an organic electroluminescent display device according to the related art.
Figure 3:
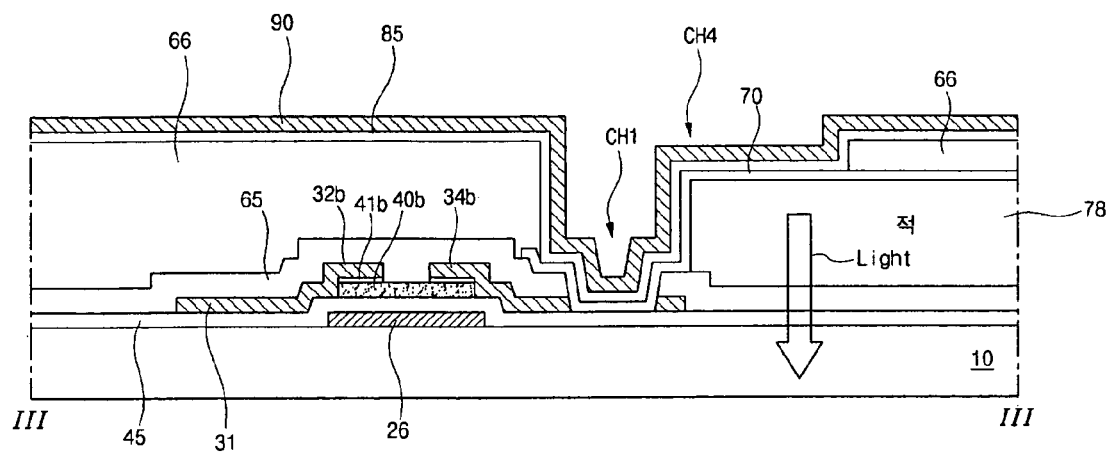
FIG. 3 is a cross-sectional view taken along a line III-III of FIG. 2.
Figure 4:
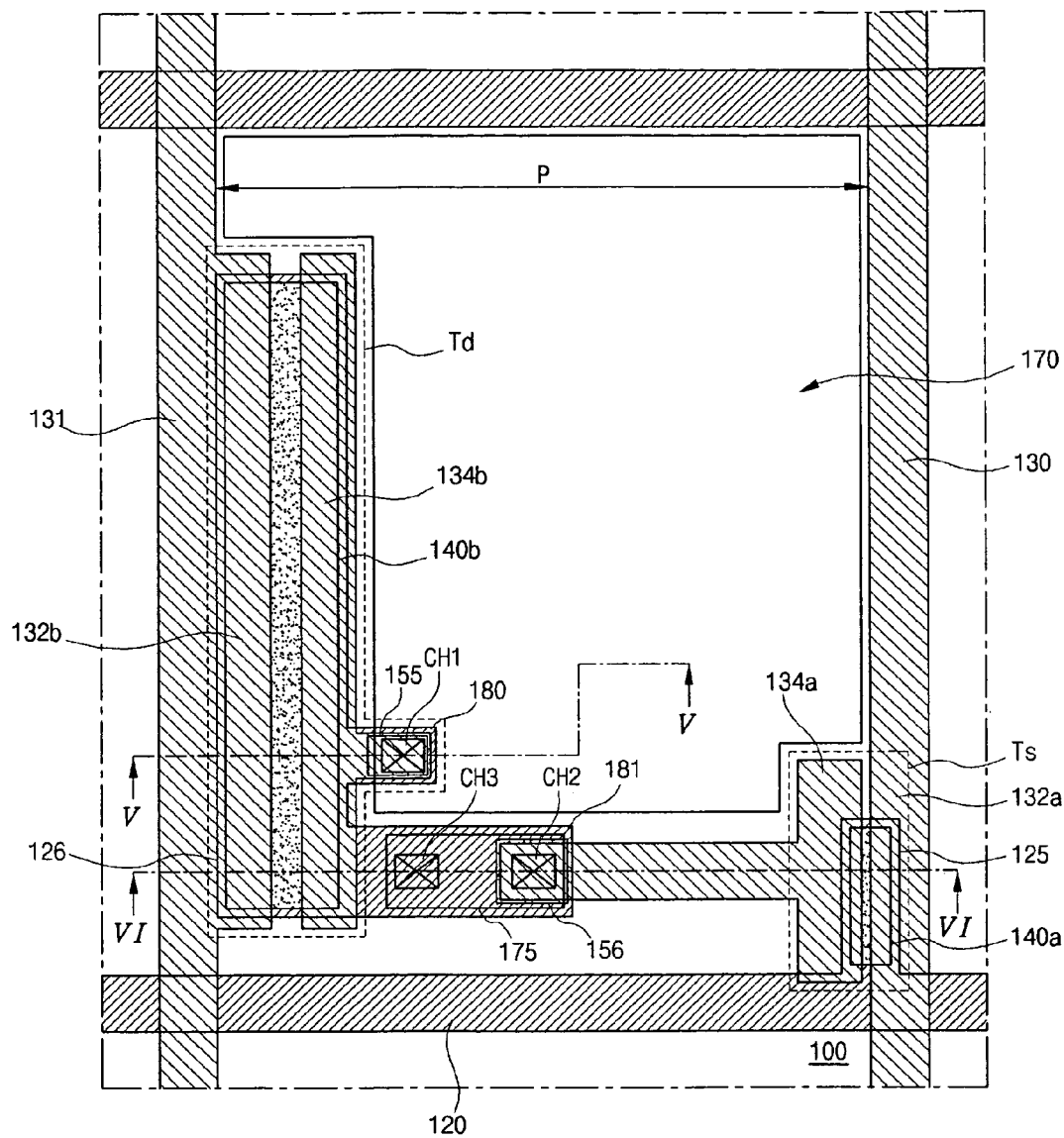
FIG. 4 is a plane view showing an array substrate for an organic electroluminescent display device according to a first embodiment of the present invention.

FIG. 4 is a plane view showing an array substrate for an organic electroluminescent display device according to a first embodiment of the present invention.

In FIG. 4, a gate line 120, a data line 130 and a power line 131 are formed on a substrate 100. The gate line 120 crosses the data line 130 to define a pixel region P, and the power line 130 is parallel to and spaced apart from the data line 130. The substrate 100 includes a transparent material such as glass and plastic. A switching element Ts is connected to the gate line 120 and the data line 130, and a driving element Td is connected to the switching element Ts. The switching element Ts includes a first gate electrode 125, a first active layer 140a, a first ohmic contact layer (not shown), a first source electrode 132a and a first drain electrode 134a. In addition, the driving element Td includes a second gate electrode 126, a second active layer 140b, a second ohmic contact layer (not shown), a second source electrode 132b and a second drain electrode 134b. Portions of the data line 130 and the power line 131 may be used as the first and second source electrodes 132a and 132b, respectively. A transparent first electrode 170 in the pixel region P is connected to the second drain electrode 134b through a first contact hole CH1. Further, a transparent connection line 175 is connected to the first drain electrode 134a through a second contact hole CH2 and the second gate electrode 126 through a third contact hole CH3, thereby connecting the first drain electrode 134a and the second gate electrode 126.

A first buffer pattern 155 is formed under the first drain electrode 134a corresponding to the first contact hole CH1, and a second buffer pattern 156 is formed under the second drain electrode 134b corresponding to the second contact hole CH2. The first and second buffer patterns 155 and 156 prevent etch of a gate insulating layer (not shown) while the first and second contact holes CH1 and CH2 are formed. Further, the first and second buffer patterns 155 and 156 each having an island shape may include the same material and the same layer as the first and second active layers 140a and 140b. Moreover, first and second shield patterns 180 and 181 including the same material and the same layer as the gate line 120 are formed under the first and second buffer patterns 155 and 156, respectively. The first and second shield patterns 180 and 181 completely cover the first and second contact holes CH1 and CH2, respectively. Although the first and second shield patterns 180 and 181 extend from the second gate electrode 126 in the first embodiment, the first and second shield patterns 180 and 181 may have an island shape in another embodiment.

Since the etch of the gate insulating layer is prevented by the first and second buffer patterns 155 and 156, step differences on side surfaces of the first and second contact holes CH1 and CH2 are minimized. As a result, contact properties between the first electrode 170 and the second drain electrode 134b and between connection line 175 and the first drain electrode 134a are improved due to prevention of electric opening. Furthermore, light leakage at the first and second contact holes CH1 and CH2 is prevented by the first and second shielding patterns 180 and 181.

FIGS. 5A to 5E are cross-sectional views, which taken along a line V-V of FIG. 4, showing a method of fabricating an electroluminescent display device according to a first embodiment of the present invention, and FIGS. 6A to 6E are cross-sectional views, which taken along a line VI-VI of FIG. 4, showing a method of fabricating an electroluminescent display device according to a first embodiment of the present invention.

Figure 5A:
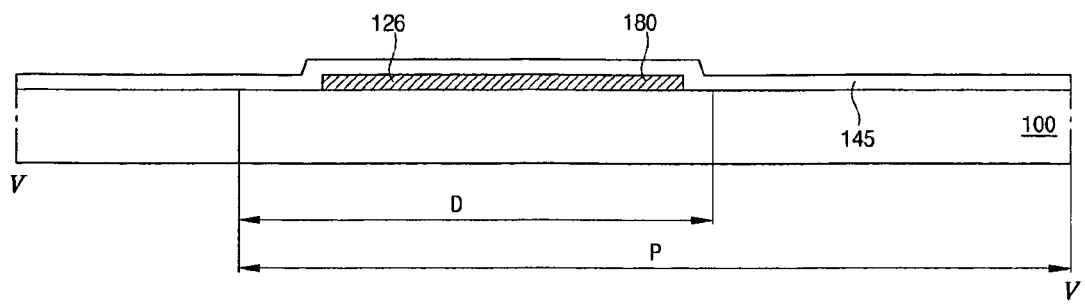
FIGS. 5A to 5E are cross-sectional views, which taken along a line V-V of FIG. 4, showing a method of fabricating an electroluminescent display device according to a first embodiment of the present invention.
Figure 6A:
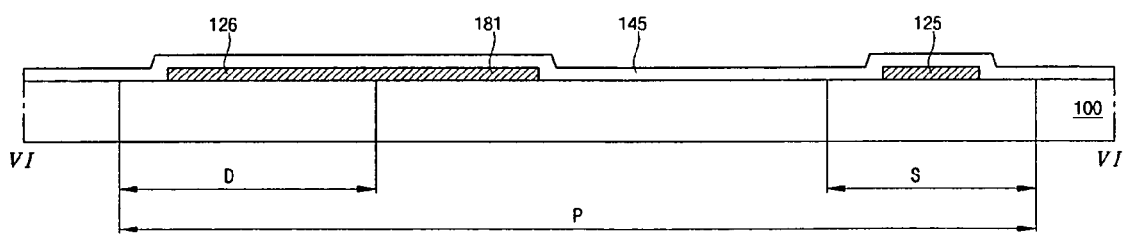
FIGS. 6A to 6E are cross-sectional views, which taken along a line VI-VI of FIG. 4, showing a method of fabricating an electroluminescent display device according to a first embodiment of the present invention.

In FIGS. 5A and 6A, a gate line 120 (of FIG. 4), a first gate electrode 125 and a second gate electrode 126 are formed on a substrate 100 having a pixel region P, a switching region S and a driving region D. The first gate electrode 125 extends from the gate line 120. The first and second gate electrodes 125 and 126 correspond to the switching region S and the driving region D, respectively. At the same time, first and second shield patterns 180 and 181 extending from the first gate electrode 125 are formed on the substrate 100. The first and second shield patterns 180 and 181 may have an island shape in another embodiment. The gate line 120, the first gate electrode 125, the second gate electrode 126, the first shield pattern 180 and the second shield pattern 181 include an opaque metallic material. Next, a gate insulating layer 145 is formed on the first and second gate electrodes 125 and 126 and the first and second shield patterns 180 and 181. The gate insulating layer 145 may include an inorganic insulating material such as silicon oxide ($SiO_2$) and silicon nitride ($SiN_x$).

Figure 5B:
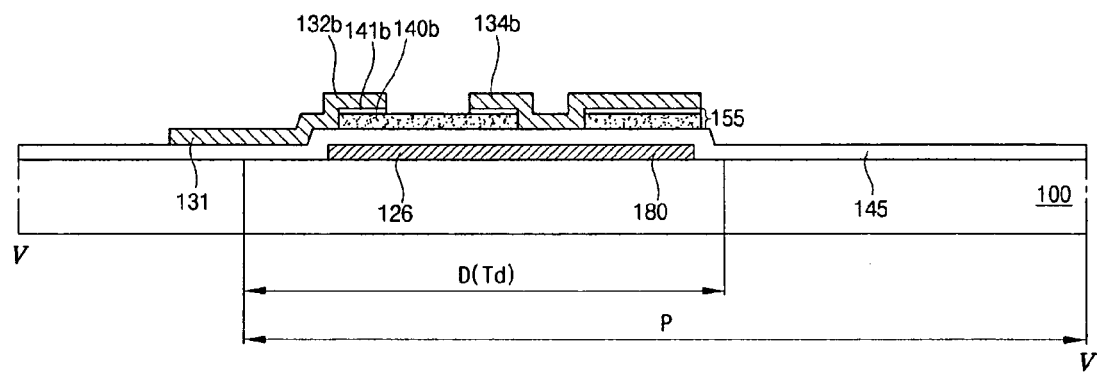
Figure 6B:
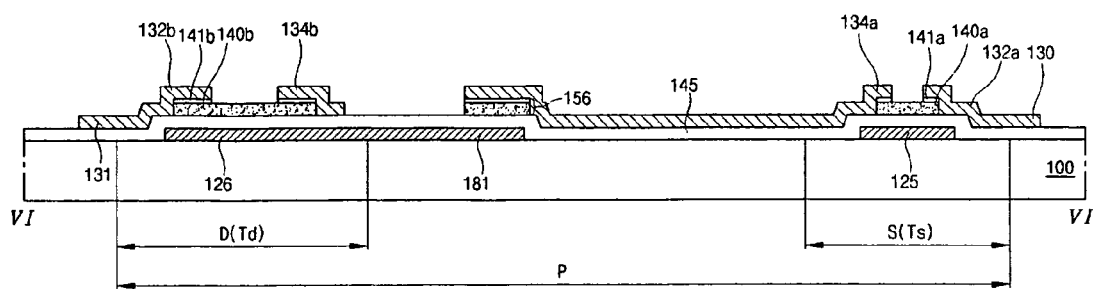

In FIGS. 5B and 6B, a first active layer 140a and a first ohmic contact layer 141a are sequentially formed on the gate insulating layer 145 over the first gate electrode 125 by depositing and patterning an intrinsic amorphous silicon material layer (not shown) and an impurity-doped amorphous silicon layer (not shown). In addition, a second active layer 140b and a second ohmic contact layer 141b are sequentially formed on the gate insulating layer 145 over the second gate electrode 126. At the same time, first and second buffer patterns 155 and 156 having an island shape are formed on the gate insulating layer 145 to overlap the first and second shield patterns 180 and 181, respectively. The first and second buffer patterns 155 and 156 have a double-layered structure of the intrinsic amorphous silicon layer and the impurity-doped amorphous silicon layer.

Next, a first source electrode 132a and a first drain electrode 134a are formed on the first ohmic contact layer 141b, and a second source electrode 132b and a second drain electrode 134b are formed on the second ohmic contact layer 141b. In addition, a data line 130 connected to the first source electrode 132a and a power line 131 connected to the second source electrode 132b are formed on the gate insulating layer 145. The data line 130 and the power line 131 cross the gate line 120. The first source electrode 132a, the first drain electrode 134a, the second source electrode 132b, the second drain electrode 134b, the data line 130 and the power line 131 include a conductive metallic material such as molybdenum (Mo) and molybdenum (Mo) alloy. The impurity-doped amorphous silicon layer between the first source and drain electrodes 132a and 134a and between the second source and drain electrodes 132b and 134b is removed to expose the first and second active layers 140a and 140b. The first gate electrode 125, the first active layer 140a, the first source electrode 132a and the first drain electrode 134a constitute a switching element Ts in the switching region S, and the second gate electrode 126, the second active layer 140b, the second source electrode 132b and the second drain electrode 134b constitute a driving element Td in the driving region D.

Figure 5C:
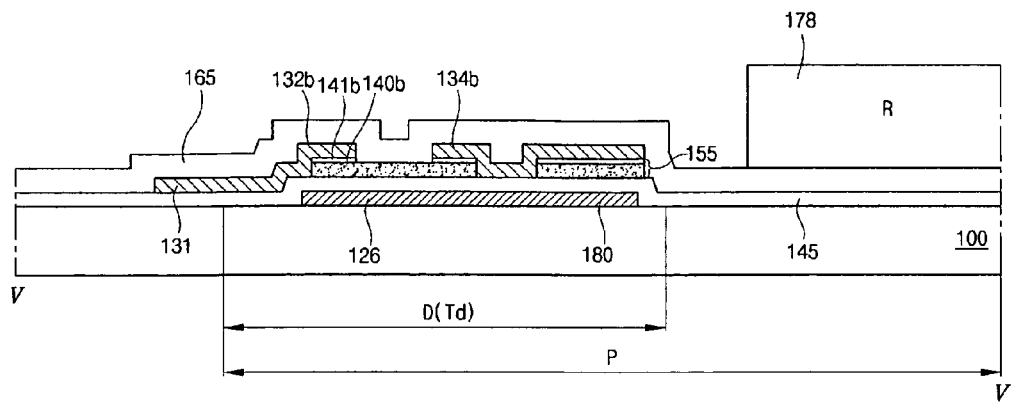
Figure 6C:
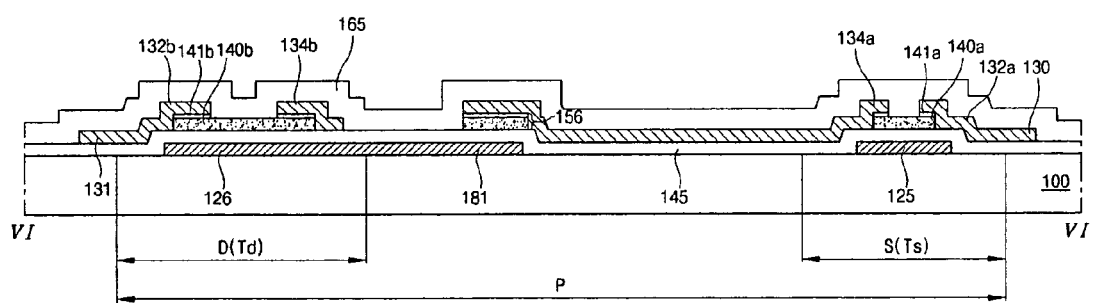

In FIGS. 5C and 6C, a first passivation layer 165 is formed on the switching element Ts and the driving element Td. The first passivation layer 165 may include one of an inorganic insulating material such as silicon oxide ($SiO_2$) and silicon nitride ($SiN_x$) and an organic insulating material such as benzocyclobutene (BCB) and acrylic resin. Next, a color filter layer 178 including red, green and blue color filters is formed on the first passivation layer 165 in the pixel region P by repeating deposition and patterning of photosensitive color resin.

Figure 5D:
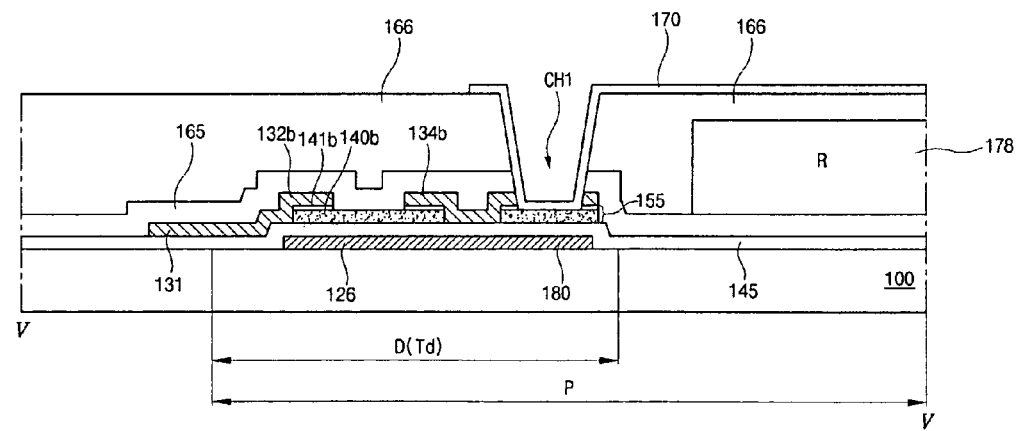
Figure 6D:
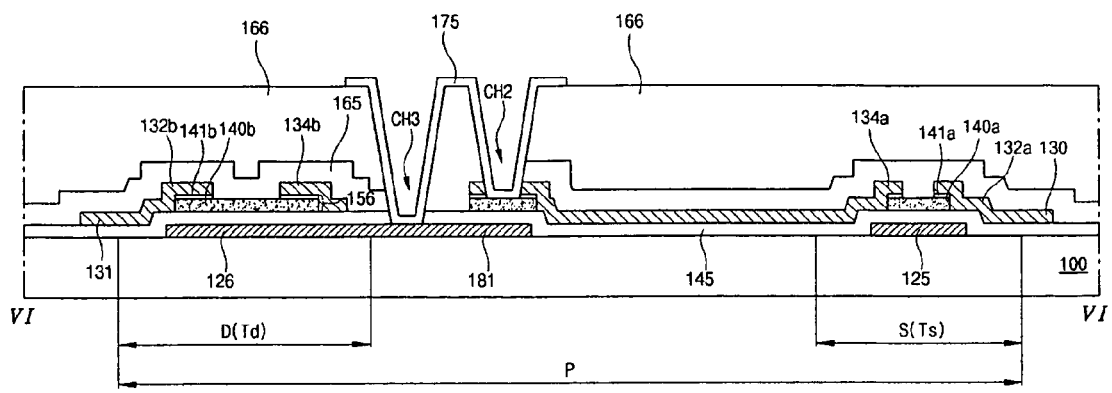

In FIGS. 5D and 6D, a second passivation layer 166 is formed on the color filter layer 178. The second passivation layer 166 may include an organic insulating material such as benzocyclobutene (BCB) and acrylic resin. A top surface of the substrate 100 having the color filter layer 178 is planarized by the second passivation layer 166. Next, the first and second passivation layers 165 and 166 are patterned to form a first contact hole CH1, a second contact hole CH2 and a third contact hole CH3. The first contact hole CH1 exposes the second drain electrode 134b and the second contact hole CH2 exposes the first drain electrode 134a. In addition, the third contact hole CH3 exposes the second gate electrode 126.

Here, an exposed portion of the second drain electrode 134b and the first drain electrode 134a through the first and second contact holes CH1 and CH2 is removed. However, since the first and second buffer patterns 155 and 156 are disposed at bottoms of the first and second contact holes CH1 and CH2, the gate insulating layer 145 is not removed during the step of forming the first and second contact holes CH1 and CH2. As a result, step differences are not generated on side surfaces of the first and second contact holes CH1 and CH2, and a first electrode 170 and a connection line 175 are reliably connected to the second drain electrode 134b and the first drain electrode 134a, respectively, without electric opening. The impurity-doped amorphous silicon layer of the first and second buffer patterns 155 and 156 may be removed during the step of forming the first and second contact holes CH1 and CH2.

Next, a first electrode 170 and a connection line 175 are formed on the second passivation layer 166 by depositing and patterning a transparent conductive material such as indium-tin-oxide (ITO) and indium-zinc-oxide (IZO). The first electrode 170 is connected to the second drain electrode 134b through the first contact hole CH1, and the connection line 175 is connected to the first drain electrode 134a and the second gate electrode 126 through the third contact hole CH3.

Figure 5E:
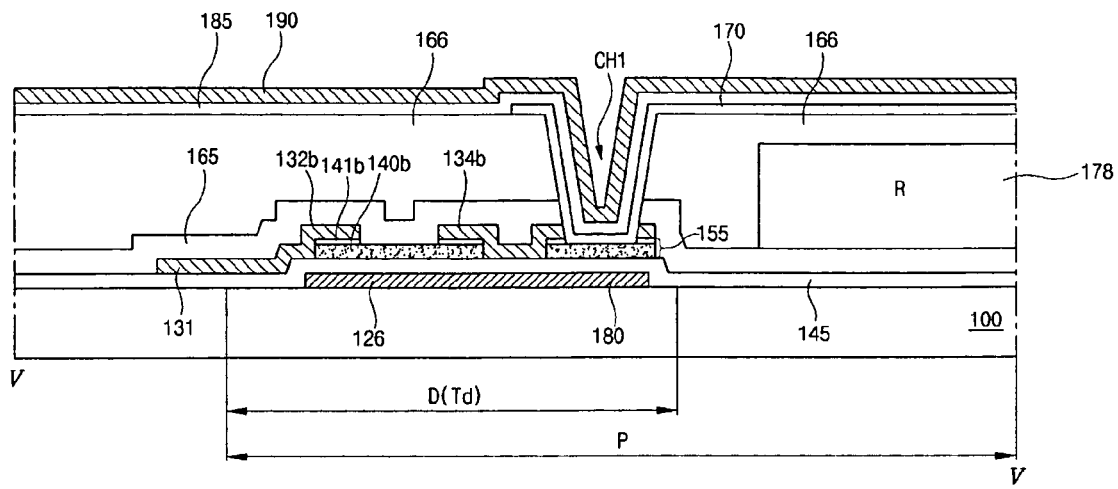
Figure 6E:
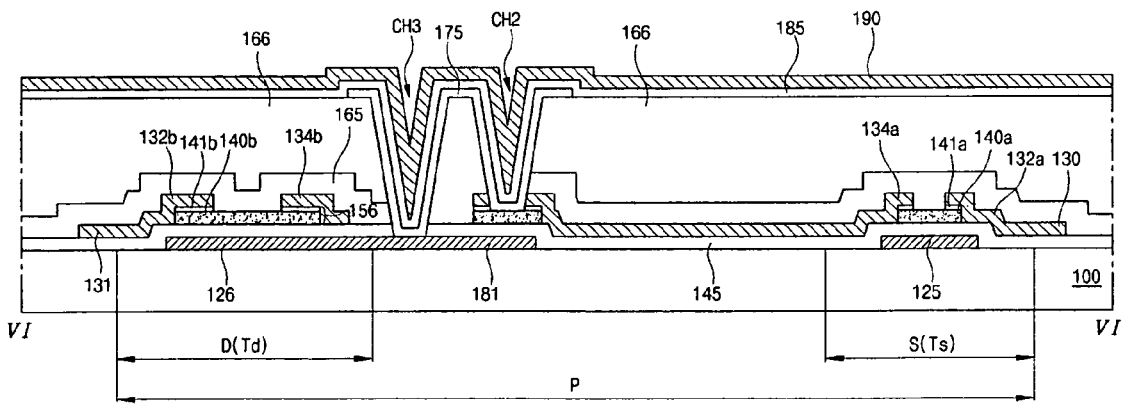

In FIGS. 5E and 6E, an organic electroluminescent layer 185 and a second electrode 190 are sequentially formed on the first electrode 170. The organic electroluminescent layer 185 may have a single-layered structure or a double-layered structure, for example, including a hole injecting layer, a hole transporting layer, an emitting material layer, an electron transporting layer and an electron injecting layer between the first and second electrodes 170 and 190. The second electrode 190 may include one of aluminum (Al), calcium (Ca) and magnesium (Mg). The first electrode 170, the organic electroluminescent layer 185 and the second electrode 190 constitute an organic electroluminescent diode emitting white-colored light. Although not shown in FIGS. 5E and 6E, the substrate 100 having the switching element Ts, the driving element Td and the organic electroluminescent diode may be encapsulated by an opposite substrate with a sealant.

In the organic ELD device according to the first embodiment of the present invention, since the first and second shield patterns 180 and 181 are formed on the substrate 100 corresponding to the first and second contact holes CH1 and CH2, respectively, light from the organic electroluminescent layer 185 corresponding to the first and second contact holes CH1 and CH2 is shielded by the first and second shield patterns 180 and 181. As a result, light leakage at contact holes is prevented and display quality is improved.

Since the switching element Ts and the driving element Td are an amorphous silicon thin film transistor (TFT), the switching element Ts and the driving element Td may be deteriorated due to a continuous current driving. Accordingly, display quality of the organic ELD device may be degraded. Specifically, since the driving element Td experiences a large current stress and the display quality of the organic ELD device depends on the property of the driving element Td, detection and correction of electric property of the driving element Td are required.

Furthermore, although the organic ELD device includes the color filter layer 178 and the organic electroluminescent layer 185 emitting white-colored light in the first embodiment of the present invention, an organic ELD device may include an organic electroluminescent layer emitting red, green and blue colored light in respective pixel region without a color filter layer in another embodiment. In the organic ELD device without color filter layer, light leakage through a drain contact hole is prevented by shield patterns under the drain contact hole.

Figure 7:
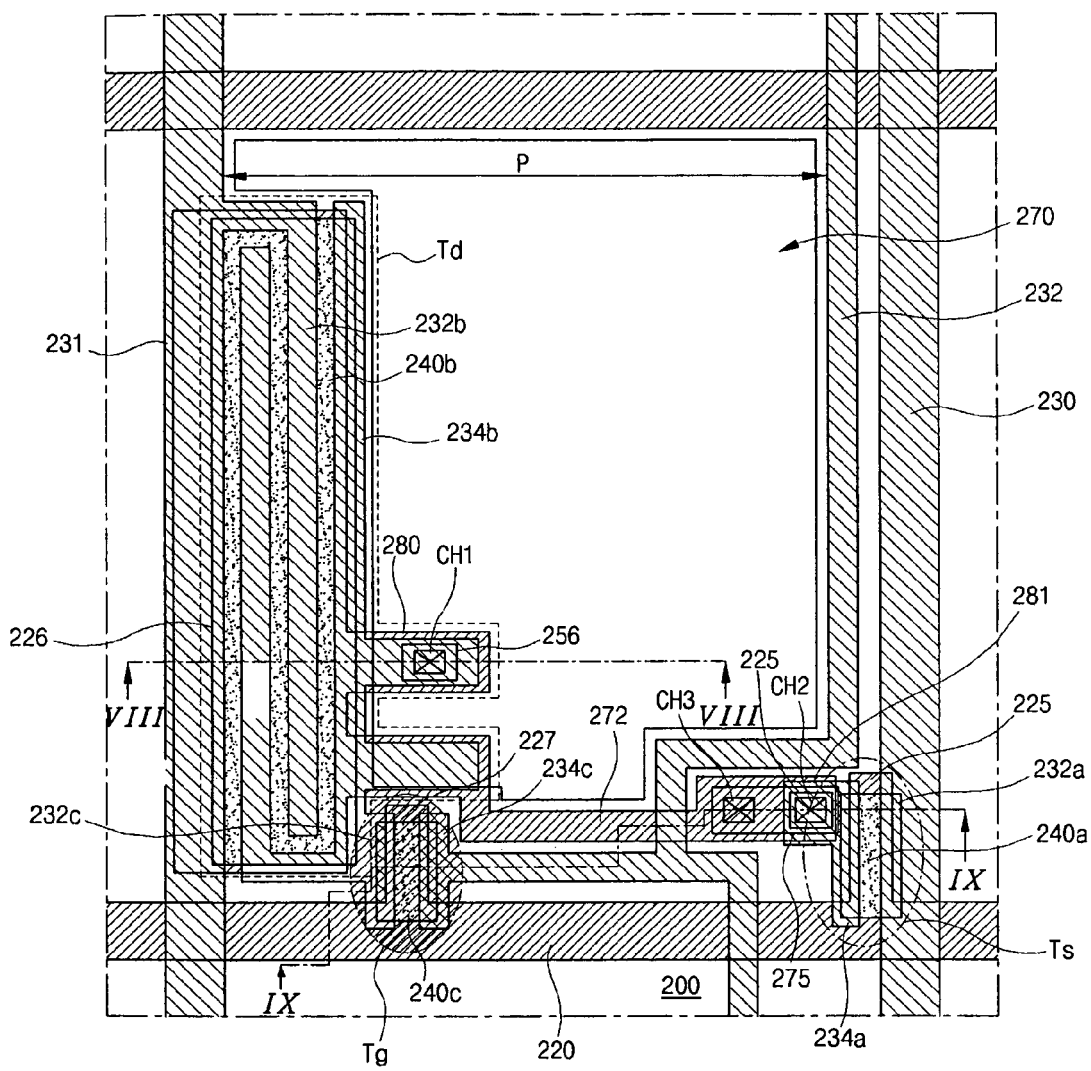
FIG. 7 is a plane view showing an array substrate for an organic electroluminescent display device according to a second embodiment of the present invention.

FIG. 7 is a plane view showing an array substrate for an organic electroluminescent display device according to a second embodiment of the present invention.

In FIG. 7, a gate line 220, a data line 230 and a power line 231 are formed on a substrate 200. The gate line 220 crosses the data line 230 to define a pixel region P, and the power line 230 is parallel to and spaced apart from the data line 230. The substrate 200 includes a transparent material such as glass and plastic. A switching element Ts is connected to the gate line 220 and the data line 230, and a driving element Td is connected to the switching element Ts. The switching element Ts includes a first gate electrode 225, a first active layer 240a, a first ohmic contact layer (not shown), a first source electrode 232a and a first drain electrode 234a. In addition, the driving element Td includes a second gate electrode 226, a second active layer 240b, a second ohmic contact layer (not shown), a second source electrode 232b and a second drain electrode 234b. Portions of the data line 230 and the power line 231 may be used as the first and second source electrodes 232a and 232b, respectively. A gate extension line 272 extends from the second gate electrode 226 to the switching region S.

A transparent first electrode 270 in the pixel region P is connected to the second drain electrode 234b through a first contact hole CH1. Further, a-transparent connection line 275 is connected to the first drain electrode 234a through a second contact hole CH2 and the gate extension line 272 through a third contact hole CH3, thereby connecting the first drain electrode 234a and the gate extension line 272.

Here, the second source and drain electrodes 232b and 234b have a finger shape, and the second gate electrode 226 under the second source and drain electrodes 232b and 234b completely overlaps the second source and drain electrodes 232b and 234b. Accordingly, the second source and drain electrodes 232b and 234b are disposed within the second gate electrode 226. An exposed portion between the second source and drain electrodes 232b and 234b constitutes a channel of the driving element Td. Since the second source and drain electrodes 232b and 234b have a finger shape, a width W of the channel increases and a length L of the channel decreases. As a result, a current stress applied to the driving element Td is dispersed and a current efficiency of the driving element Td is improved, thereby minimizing deterioration of the driving element Td.

A first buffer pattern 255 is formed under the first drain electrode 234a corresponding to the first contact hole CH1, and a second buffer pattern 256 is formed under the second drain electrode 234b corresponding to the second contact hole CH2. The first and second buffer patterns 255 and 256 prevent etch of a gate insulating layer (not shown) while the first and second contact holes CH1 and CH2 are formed. Further, the first and second buffer patterns 255 and 256 each having an island shape may include the same material and the same layer as the first and second active layers 240a and 240b. Moreover, first and second shield patterns 280 and 281 are formed under the first and second buffer patterns 255 and 256, respectively. The first and second shield patterns 280 and 281 completely cover the first and second contact holes CH1 and CH2, respectively. Although the first and second shield patterns 280 and 281 extend from the second gate electrode 226 in the second embodiment, the first and second shield patterns 280 and 281 may have an island shape in another embodiment.

Specifically, the first shield pattern 280 blocks light from an organic electroluminescent layer (not shown) over the first contact hole CH1, and the second shield pattern 281 blocks light from the organic electroluminescent layer in the pixel region adjacent to the second contact hole CH2.

A detection line 232 is formed to be parallel to and spaced apart from the data line 230, and a detection element Tg is connected to the detection line 232. The detection element Tg includes a third gate electrode 227, a third active layer 240c, a third ohmic contact layer (not shown), a third source electrode 232c and a third drain electrode 234c. The third gate electrode extends from the gate line 220. In addition, the third source electrode 232c is connected to the second source electrode 232b and the third drain electrode 234c is connected to the detection line 232. Since the third source electrode 232c is connected to the second source electrode 232b, the third source electrode 232c is connected to the power line 231.

While the gate line is selected, the switching element Ts is turned on and a first signal is applied to the second gate electrode 226 of the driving element Td and a second signal corresponding to the first signal is applied to the first electrode 270 through the driving element Td. In addition, while the gate line is selected, the detection element Tg is also turned on and a current corresponding to the second signal of the driving element Td flows the detection element Tg. As a result, the detection element Tg reflects a state of the driving element Td, and deterioration of the driving element Td is detected by measuring the current of the detection element Tg. The deterioration of the driving element Td is compensated based on the detection result. For example, when the driving element Td is deteriorated more than a reference value, a gamma reference voltage for the organic ELD device may be changed or a high level voltage applied to the power line 231 may be changed.

Further, since the etch of the gate insulating layer is prevented by the first and second buffer patterns 255 and 256, step differences on side surfaces of the first and second contact holes CH1 and CH2 are minimized. As a result, contact properties between the first electrode 270 and the second drain electrode 234b and between connection line 275 and the first drain electrode 234a are improved due to prevention of electric opening. Furthermore, light leakage at the first and second contact holes CH1 and CH2 is prevented by the first and second shielding patterns 280 and 281 of an opaque material.

FIGS. 8A to 8E are cross-sectional views, which taken along a line VIII-VIII of FIG. 7, showing a method of fabricating an electroluminescent display device according to a second embodiment of the present invention, and FIGS. 9A to 9E are cross-sectional views, which taken along a line IX-IX of FIG. 7, showing a method of fabricating an electroluminescent display device according to a second embodiment of the present invention.

Figure 8A:
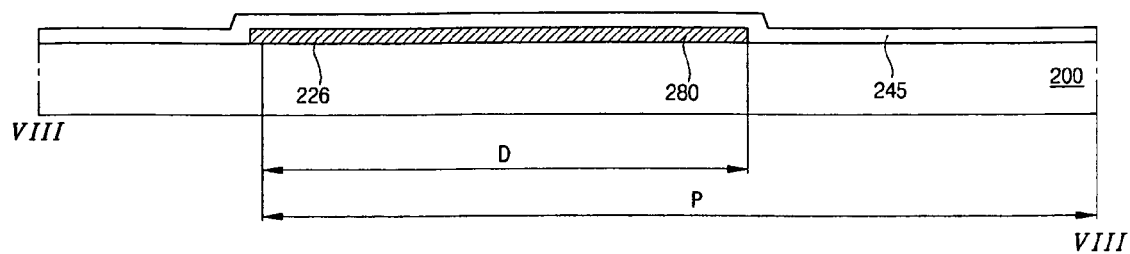
FIGS. 8A to 8E are cross-sectional views, which taken along a line VIII-VIII of FIG. 7, showing a method of fabricating an electroluminescent display device according to a second embodiment of the present invention.
Figure 9A:
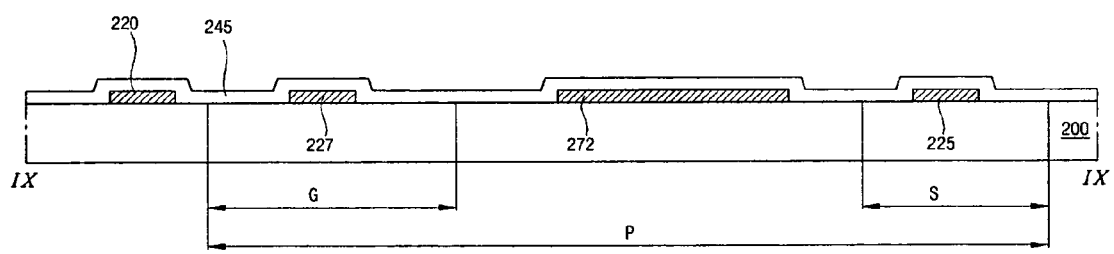
FIGS. 9A to 9E are cross-sectional views, which taken along a line IX-IX of FIG. 7, showing a method of fabricating an electroluminescent display device according to a second embodiment of the present invention.

In FIGS. 8A and 9A, a gate line 220 (of FIG. 7), a first gate electrode 225, a second gate electrode 226, a third gate electrode 227 and a gate extension line 272 are formed on a substrate 200 having a pixel region P, a switching region S, a driving region D and a detection region G. The first and third gate electrodes 225 and 227 extend from the gate line 220. The first, second and third gate electrodes 225, 226 and 227 correspond to the switching region S, the driving region D and the detection region G, respectively. The gate extension line 272 extends from the second gate electrode 226 to the switching region S. At the same time, first and second shield patterns 280 and 281 extending from the first gate electrode 225 are formed on the substrate 200. The first and second shield patterns 280 and 281 may have an island shape in another embodiment. The gate line 220, the first gate electrode 225, the second gate electrode 226, the third gate electrode 227, the gate extension line 272, the first shield pattern 280 and the second shield pattern 281 include an opaque metallic material. Next, a gate insulating layer 245 is formed on the first to third gate electrodes 225 to 227 and the first and second shield patterns 280 and 281. The gate insulating layer 245 may include an inorganic insulating material such as silicon oxide ($SiO_2$) and silicon nitride ($SiN_x$).

Figure 8B:
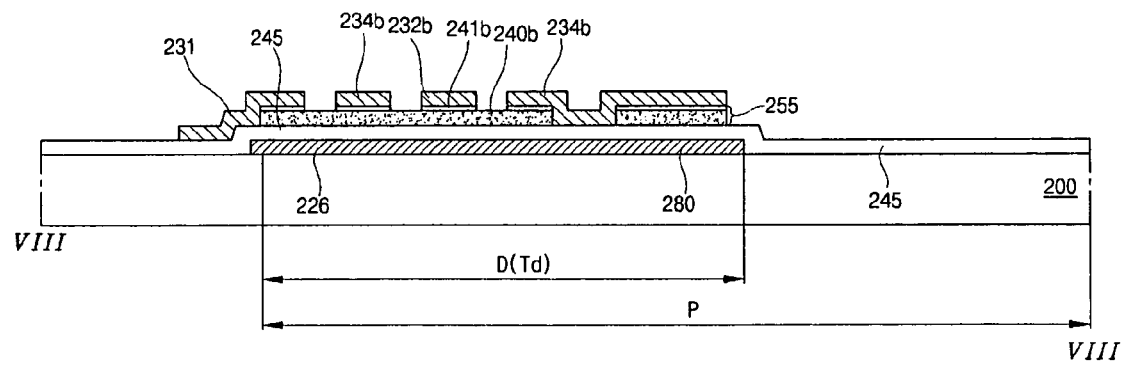
Figure 9B:
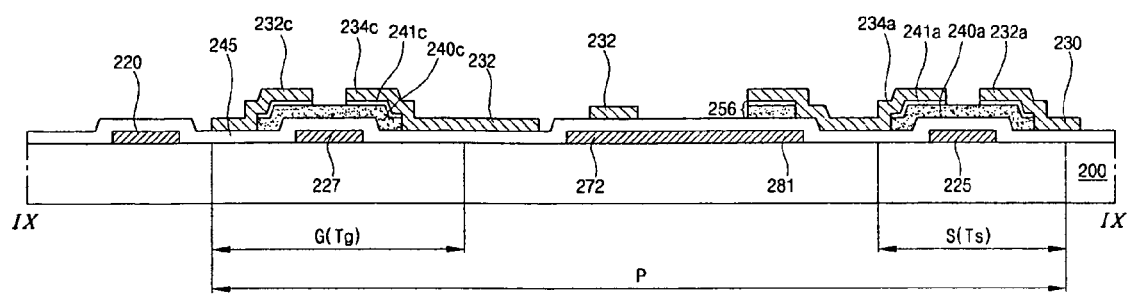

In FIGS. 8B and 9B, a first active layer 240a and a first ohmic contact layer 241a are sequentially formed on the gate insulating layer 245 over the first gate electrode 225 by depositing and patterning an intrinsic amorphous silicon material layer (not shown) and an impurity-doped amorphous silicon layer (not shown). Similarly, a second active layer 240b and a second ohmic contact layer 241b are sequentially formed on the gate insulating layer 245 over the second gate electrode 226, and a third active layer 240c and a third ohmic contact layer 241c are sequentially formed on the gate insulating layer 245 over the third gate electrode 227. At the same time, first and second buffer patterns 255 and 256 having an island shape are formed on the gate insulating layer 245 to overlap the first and second shield patterns 280 and 281, respectively. The first and second buffer patterns 255 and 256 have a double-layered structure of the intrinsic amorphous silicon layer and the impurity-doped amorphous silicon layer.

Next, a first source electrode 232a and a first drain electrode 234a are formed on the first ohmic contact layer 241b, and a second source electrode 232b and a second drain electrode 234b are formed on the second ohmic contact layer 241b. Further, a third source electrode 232c and a third drain electrode 234c are formed on the third ohmic contact layer 241c. In addition, a data line 230 connected to the first source electrode 232a, a power line 231 connected to the second and third source electrodes 232b and 232c and a detection line 232 connected to the third drain electrode 234c are formed on the gate insulating layer 245. The data line 230, the power line 231 and the detection line 232 cross the gate line 220. The first source electrode 232a, the first drain electrode 234a, the second source electrode 232b, the second drain electrode 234b, the third source electrode 232c, the third drain electrode 234c, the data line 230, the power line 231 and the detection line 232 include a conductive metallic material such as molybdenum (Mo) and molybdenum (Mo) alloy. The impurity-doped amorphous silicon layer between the first source and drain electrodes 232a and 234a, between the second source and drain electrodes 232b and 234b and between the third source and drain electrodes 232c and 234c is removed to expose the first, second and third active layers 140a, 140b and 140c. The first gate electrode 225, the first active layer 240a, the first source electrode 232a and the first drain electrode 234a constitute a switching element Ts in the switching region S. Similarly, the second gate electrode 226, the second active layer 240b, the second source electrode 232b and the second drain electrode 234b constitute a driving element Td in the driving region D, and the third gate electrode 227, the third active layer 240c, the third source electrode 232c and the third drain electrode 234c constitute a detection element Tg in the detection region G.

Figure 8C:
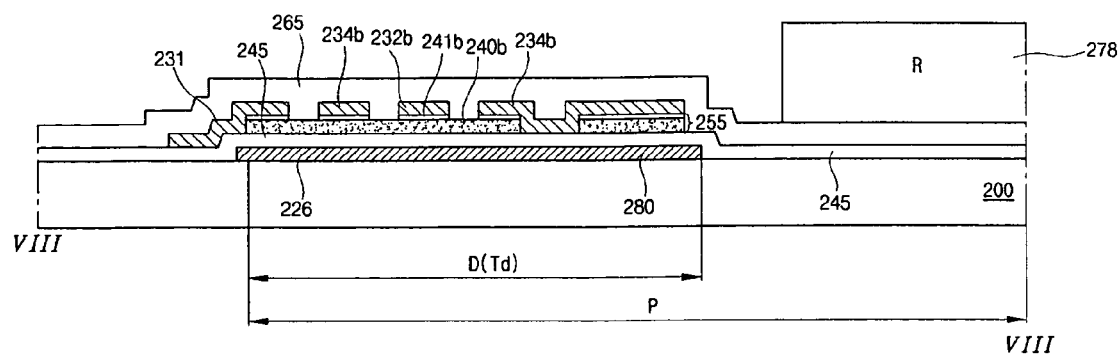
Figure 9C:
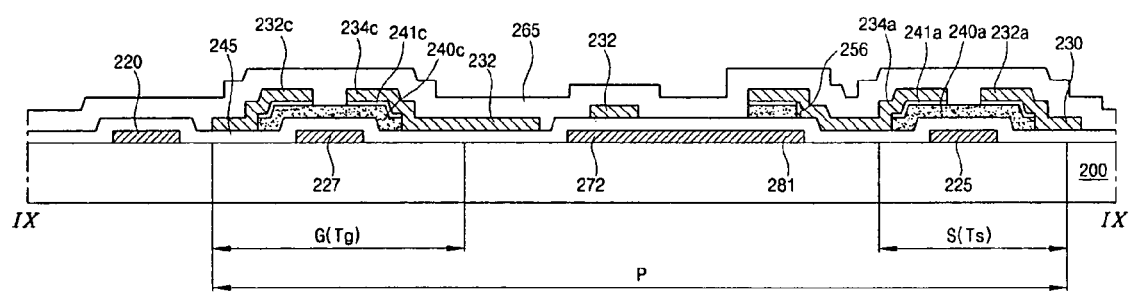

In FIGS. 8C and 9C, a first passivation layer 265 is formed on the switching element Ts and the driving element Td. The first passivation layer 265 may include one of an inorganic insulating material such as silicon oxide ($SiO_2$) and silicon nitride ($SiN_x$) and an organic insulating material such as benzocyclobutene (BCB) and acrylic resin. Next, a color filter layer 278 including red, green and blue color filters is formed on the first passivation layer 265 in the pixel region P by repeating deposition and patterning of photosensitive color resin.

Figure 8D:
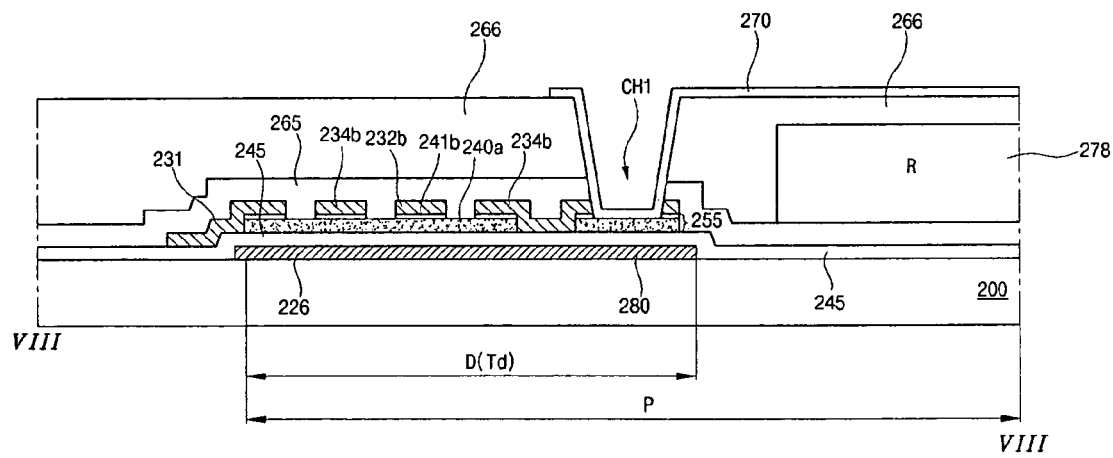
Figure 9D:
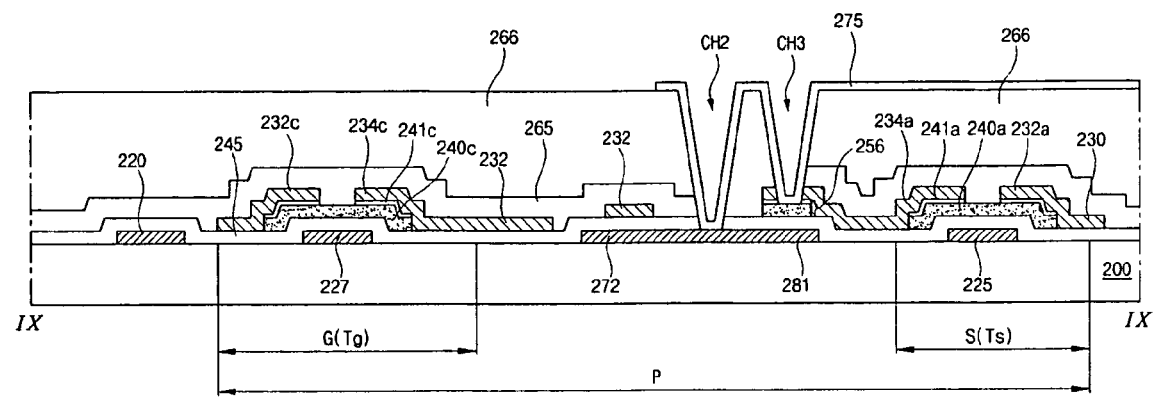

In FIGS. 8D and 9D, a second passivation layer 266 is formed on the color filter layer 278. The second passivation layer 266 may include an organic insulating material such as benzocyclobutene (BCB) and acrylic resin. A top surface of the substrate 200 having the color filter layer 278 is planarized by the second passivation layer 266. Next, the first and second passivation layer 265 and 266 are patterned to form a first contact hole CH1, a second contact hole CH2 and a third contact hole CH3. The first contact hole CH1 exposes the second drain electrode 234b and the second contact hole CH2 exposes the first drain electrode 234a. In addition, the third contact hole CH3 exposes the second gate electrode 226.

Here, an exposed portion of the second drain electrode 234b and the first drain electrode 234a through the first and second contact holes CH1 and CH2 is removed. However, since the first and second buffer patterns 255 and 256 are disposed at bottoms of the first and second contact holes CH1 and CH2, the gate insulating layer 245 is not removed during the step of forming the first and second contact holes CH1 and CH2. As a result, step differences are not generated on side surfaces of the first and second contact holes CH1 and CH2, and a first electrode 270 and a connection line 275 are reliably connected to the second drain electrode 234b and the first drain electrode 234a, respectively, without electric opening. The impurity-doped amorphous silicon layer of the first and second buffer patterns 255 and 256 is removed during the step of forming the first and second contact holes CH1 and CH2.

Next, a first electrode 270 and a connection line 275 are formed on the second passivation layer 266 by depositing and patterning a transparent conductive material such as indium-tin-oxide (ITO) and indium-zinc-oxide (IZO). The first electrode 270 is connected to the second drain electrode 134b through the first contact hole CH1, and the connection line 275 is connected to the first drain electrode 234a and the second gate electrode 226 through the third contact hole CH3.

Figure 8E:
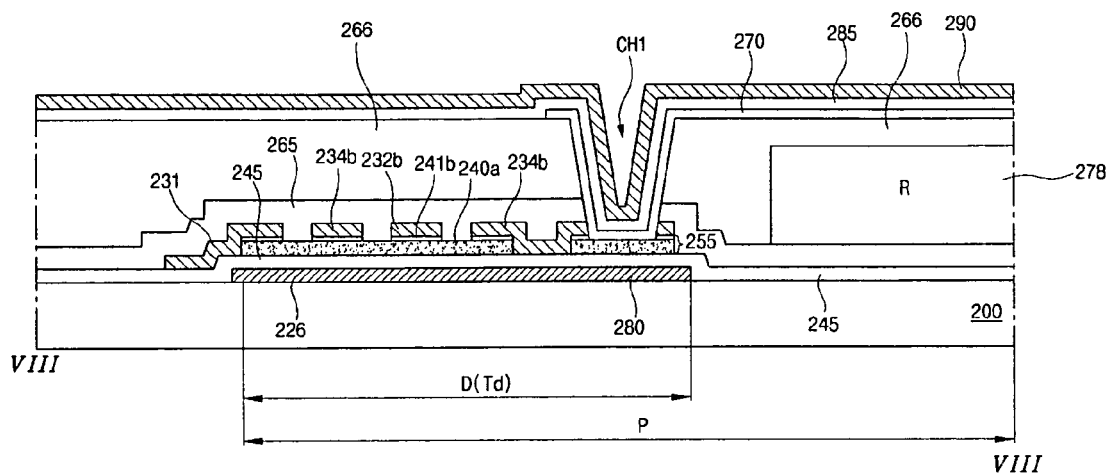
Figure 9E:
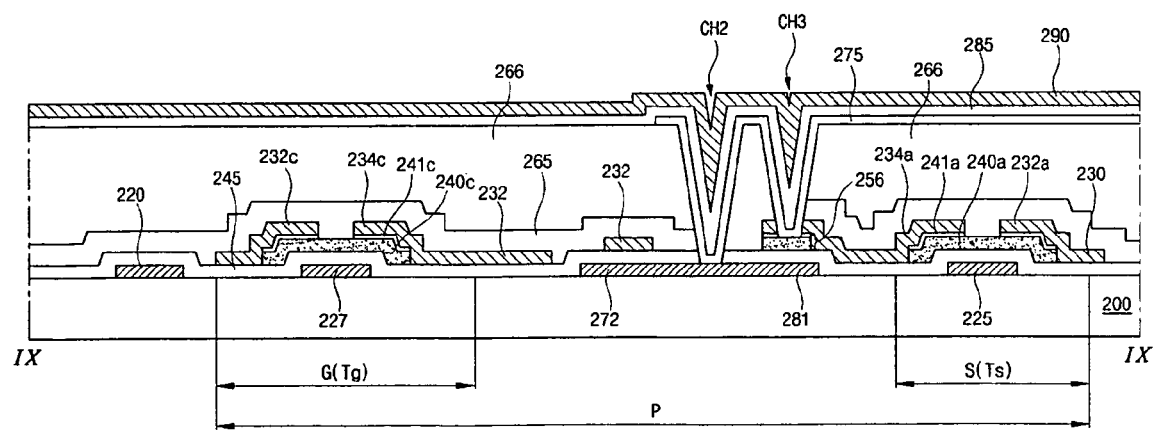

In FIGS. 8E and 9E, an organic electroluminescent layer 285 and a second electrode 290 are sequentially formed on the second passivation layer 266. The organic electroluminescent layer 285 may have a single-layered structure or a double-layered structure, for example, including a hole injecting layer, a hole transporting layer, an emitting material layer, an electron transporting layer and an electron injecting layer between the first and second electrodes 270 and 290. The second electrode 290 may include one of aluminum (Al), calcium (Ca) and magnesium (Mg). The first electrode 270, the organic electroluminescent layer 285 and the second electrode 290 constitute an organic electroluminescent diode emitting light. Although not shown in FIGS. 8E and 9E, the substrate 200 having the switching element Ts, the driving element Td and the organic electroluminescent diode may be encapsulated by an opposite substrate with a sealant.

In the organic ELD device according to the second embodiment of the present invention, since the first and second shield patterns 280 and 281 are formed on the substrate 200 corresponding to the first and second contact holes CH1 and CH2, respectively, light from the organic electroluminescent layer 285 corresponding to the first and second contact holes CH1 and CH2 is shielded by the first and second shield patterns 280 and 281. As a result, light leakage at contact holes is prevented and display quality is improved.

In addition, since the second source and drain electrodes 232b and 234b have a finger shape, the width W of the channel of the driving element Td increases and the length L of the channel of the driving element Td decreases. Accordingly, the current stress applied to the driving element Td is dispersed and deterioration of the driving element Td is minimized. Furthermore, since the electric state of the driving element Td is detected by the detection element Tg, deterioration of the driving element Td is compensated based on the result of the detection.

Furthermore, although the organic ELD device includes the color filter layer 278 and the organic electroluminescent layer 285 emitting white-colored light in the second embodiment of the present invention, an organic ELD device may include an organic electroluminescent layer emitting red, green and blue colored light in respective pixel region without a color filter layer in another embodiment. In the organic ELD device without color filter layer, light leakage through a drain contact hole is prevented by shield patterns under the drain contact hole.

Figure 10:
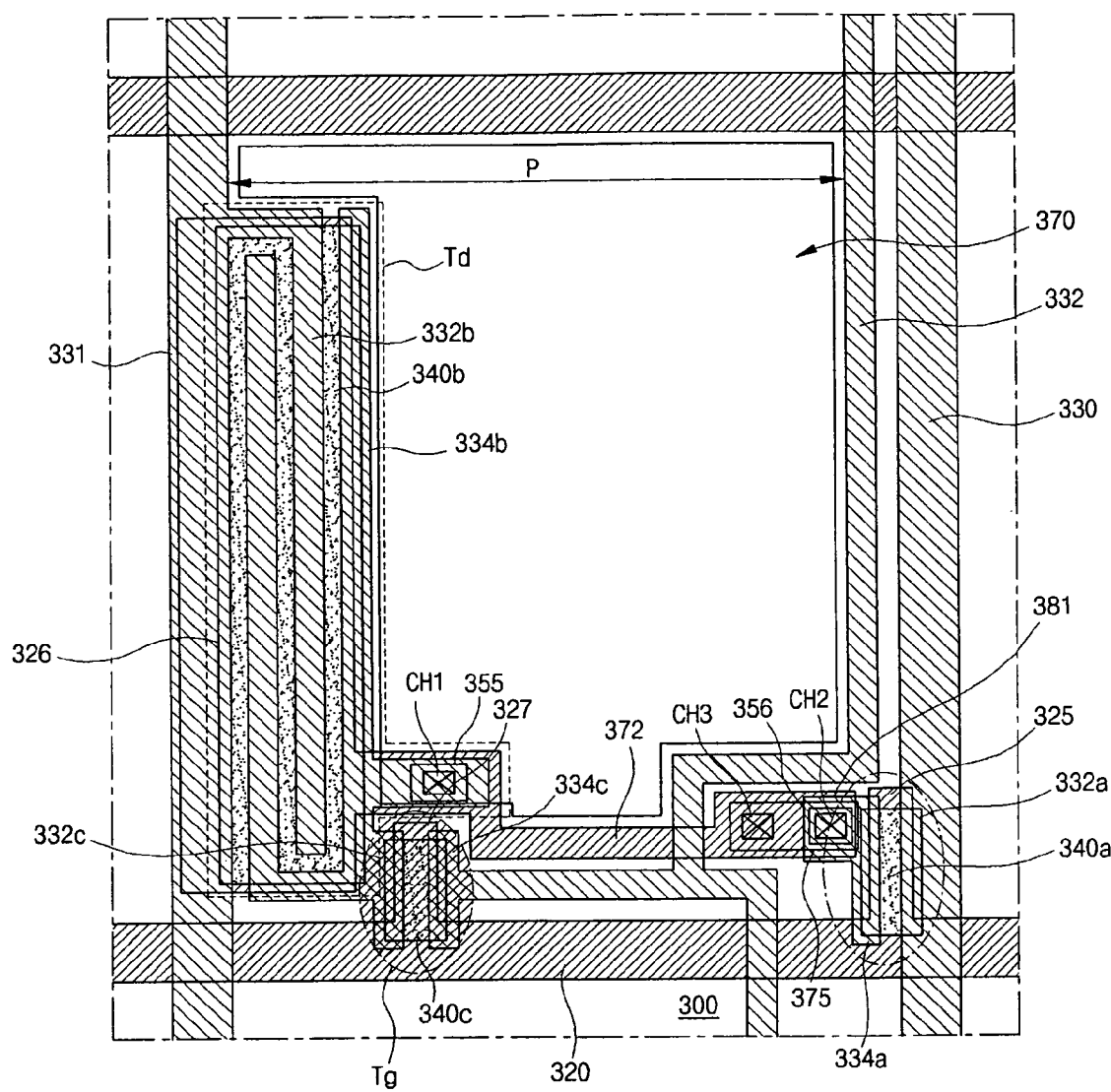
FIG. 10 is a plane view showing an array substrate for an organic electroluminescent display device according to a third embodiment of the present invention.

FIG. 10 is a plane view showing an array substrate for an organic electroluminescent display device according to a third embodiment of the present invention.

In FIG. 10, a gate line 320, a data line 330 and a power line 331 are formed on a substrate 300. The gate line 320 crosses the data line 330 to define a pixel region P, and the power line 330 is parallel to and spaced apart from the data line 330. The substrate 300 includes a transparent material such as glass and plastic. A switching element Ts is connected to the gate line 320 and the data line 330, and a driving element Td is connected to the switching element Ts. The switching element Ts includes a first gate electrode 325, a first active layer 340a, a first ohmic contact layer (not shown), a first source electrode 332a and a first drain electrode 334a. In addition, the driving element Td includes a second gate electrode 326, a second active layer 340b, a second ohmic contact layer (not shown), a second source electrode 332b and a second drain electrode 334b. Portions of the data line 330 and the power line 331 may be used as the first and second source electrodes 332a and 332b, respectively. A gate extension line 372 extends from the second gate electrode 326 to the switching region S.

A transparent first electrode 370 in the pixel region P is connected to the second drain electrode 334b through a first contact hole CH1. Further, a transparent connection line 375 is connected to the first drain electrode 334a through a second contact hole CH2 and the gate extension line 372 through a third contact hole CH3, thereby connecting the first drain electrode 334a and the gate extension line 272.

Specifically, the second drain electrode 334b is formed over the gate extension line 372 so that the second drain electrode 334b is shielded by the gate extension line 372 instead of an additional first shield pattern 280 of the second embodiment. Accordingly, a portion of the gate extension line 372 functions as a first shield pattern 280 (of FIG. 7) of the second embodiment, thereby an aperture ratio of an organic ELD device is improved.

The second source and drain electrodes 332b and 334b have a finger shape, and the second gate electrode 326 under the second source and drain electrodes 332b and 334b completely overlaps the second source and drain electrodes 332b and 334b. Accordingly, the second source and drain electrodes 332b and 334b are disposed within the second gate electrode 326. An exposed portion between the second source and drain electrodes 332b and 334b constitutes a channel of the driving element Td. Since the second source and drain electrodes 332b and 334b have a finger shape such that the second source and drain electrodes 332b and 334b alternate each other and have bent portions, a width W of the channel increases and a length L of the channel decreases. As a result, a current stress applied to the driving element Td is dispersed and a current efficiency of the driving element Td is improved, thereby minimizing deterioration of the driving element Td.

A first buffer pattern 355 is formed under the first drain electrode 334a corresponding to the first contact hole CH1, and a second buffer pattern 356 is formed under the second drain electrode 334b corresponding to the second contact hole CH2. The first and second buffer patterns 355 and 256 prevent etch of a gate insulating layer (not shown) while the first and second contact holes CH1 and CH2 are formed. Further, the first and second buffer patterns 355 and 356 each having an island shape may include the same material and the same layer as the first and second active layers 340a and 340b. Moreover, the gate extension line 372 and a shield pattern 381 are formed under the second buffer patterns 255 and 256, respectively. The gate extension line 372 and the shield patterns 281 completely cover the first and second contact holes CH1 and CH2, respectively.

Specifically, the gate extension line 372 blocks light from an organic electroluminescent layer (not shown) over the first contact hole CH1, and the shield pattern 381 blocks light from the organic electroluminescent layer in the pixel region adjacent to the second contact hole CH2.

A detection line 332 is formed to be parallel to and spaced apart from the data line 230, and a detection element Tg is connected to the detection line 332. The detection element Tg includes a third gate electrode 327, a third active layer 340c, a third ohmic contact layer (not shown), a third source electrode 332c and a third drain electrode 334c. The third gate electrode extends from the gate line 320. In addition, the third source electrode 332c is connected to the second source electrode 332b and the third drain electrode 334c is connected to the detection line 332. Since the third source electrode 232c is connected to the second source electrode 332b, the third source electrode 332c is connected to the power line 331.

While the gate line is selected, the switching element Ts is turned on and a first signal is applied to the second gate electrode 226 of the driving element Td and a second signal corresponding to the first signal is applied to the first electrode 370 through the driving element Td. In addition, while the gate line is selected, the detection element Tg is also turned on and a current corresponding to the second signal of the driving element Td flows the detection element Tg. As a result, the detection element Tg outputs a current reflecting an electric state of the driving element Td, and deterioration of the driving element Td is detected by measuring the current of the detection element Tg. The deterioration of the driving element Td is compensated based on the detection result. For example, when the driving element Td is deteriorated more than a reference value, a gamma reference voltage for the organic ELD device may be changed or a high level voltage applied to the power line 331 may be changed.

Further, since the etch of the gate insulating layer is prevented by the first and second buffer patterns 355 and 356, step differences on side surfaces of the first and second contact holes CH1 and CH2 are minimized. As a result, contact properties between the first electrode 370 and the second drain electrode 334b and between connection line 375 and the first drain electrode 234a are improved due to prevention of electric opening. Furthermore, light leakage at the first and second contact holes CH1 and CH2 is prevented by the gate extension line 372 and the shielding patterns 381 of an opaque material.

Consequently, in the present invention, since a shield pattern having the same material and the same layer as a gate line is formed under a drain contact hole corresponding to a drain electrode of a driving element contact hole, light from an organic electroluminescent layer through the drain contact hole is blocked by the shield pattern. As a result, light leakage is prevented and display quality of an organic electroluminescent display device is improved. Further, since a detection element detecting a electric state of a driving element is formed in each pixel region, the driving element is compensated according to the detection result. Accordingly, reduction of display quality of an organic electroluminescent display device due to deterioration of the driving element is prevented. Moreover, since a drain contact hole corresponding to a drain electrode of a driving element is disposed over a gate extension line, light leakage at the drain contact hole is prevented and aperture ratio of an organic electroluminescent display device is improved.

It will be apparent to those skilled in the art that various modifications and variations can be made in the organic electroluminescent display device and the method of fabricating the same of the present invention without departing from the spirit or scope of the invention. Thus, it is intended that the present invention covers the modifications and variations of this invention provided they come within the scope of the appended claims and their equivalents.

What is claimed is:

1. An organic electroluminescent display device, comprising:
    a substrate;
    a gate line, a data line, and a power line on the substrate, the gate line and the data line crossing each other to define a pixel region, the power line parallel to and spaced apart from the data line;
    a switching element connected to the gate line and the data line, the switching element including a switching gate electrode, a switching active layer, a switching source electrode and a switching drain electrode;
    a driving element connected to the switching element, the driving element including a driving gate electrode, a driving active layer, a driving source electrode and a driving drain electrode;
    a first passivation layer on the switching element and the driving element, the first passivation layer having a first contact hole exposing the driving drain electrode and a second contact hole exposing the switching drain electrode, wherein an exposed portion of the driving drain electrode through the first contact hole is removed;
    a first shield pattern directly under the first contact hole, the first shield pattern including a same material and a same layer as the gate line;
    a second shield pattern directly under the second contact hole of the first passivation layer, the second shield pattern including the same material and the same layer as the gate line;
    a first electrode over the first passivation layer, the first electrode connected to the driving drain electrode through the first contact hole;
    an organic electroluminescent layer on the first electrode; and
    a second electrode on the organic electroluminescent layer.

2. The device according to claim 1, wherein the first and second shield patterns have one of an island shape and an extended shape from the driving gate electrode.

3. The device according to claim 1, further comprising a first buffer pattern between the first shield pattern and the driving drain electrode and a second buffer pattern between the second shield pattern and the switching drain electrode.

4. The device according to claim 3, wherein the first and second buffer patterns have a same material and a same layer as the switching and driving active layers.

5. The device according to claim 1, wherein the first passivation layer has a third contact hole exposing the driving gate electrode, further comprising a connection line on the first passivation layer, the connection line connected to the switching drain electrode through the second contact hole and to the driving gate electrode through the third contact hole.

6. The device according to claim 1, further comprising:
a detection line parallel to and spaced apart from the data line; and
a detection element connected to detection line, the detection element including a detection gate electrode, a detection active layer, a detection source electrode and a detection drain electrode.

7. The device according to claim 6, wherein the detection gate electrode, the detection source electrode and the detection drain electrode are connected to the gate line, the power line and the detection line, respectively.

8. The device according to claim 6, wherein the detection element outputting a current reflecting an electric state of the driving element.

9. The device according to claim 6, further comprising a gate extension line extending from the driving gate electrode, wherein the first contact hole is disposed over the gate extension line and the first shield pattern include a portion of the gate extension line.

10. The device according to claim 1, wherein the driving source and drain electrodes have a finger shape.

11. The device according to claim 1, wherein the switching source and drain electrodes are connected to the data line and the driving gate electrode, respectively, and the driving source electrode is connected to the power line.

12. The device according to claim 1, wherein the first electrode includes one of indium-tin-oxide (ITO) and indium-zinc-oxide (IZO) and the second electrode includes one of aluminum (Al), calcium (Ca) and magnesium (Mg).

13. The device according to claim 1, wherein the organic luminescent layer comprises:
a hole injecting layer on the first electrode;
a hole transporting layer on the hole injecting layer;
an emitting material layer on the hole transporting layer;
an electron transporting layer on the emitting material layer; and
an electron injection layer on the electron transporting layer.

14. The device according to claim 1, further comprising:
a color filter layer on the first passivation layer; and
a second passivation layer on the color filter layer, the first electrode formed on the second passivation layer.

15. A method of fabricating an organic electroluminescent display device, comprising:
forming a gate line, a switching gate electrode, a driving gate electrode, a first shield pattern and a second shield pattern on a substrate, the switching gate electrode connected to the gate line;
forming a gate insulating layer on the gate line, the switching gate electrode, the driving gate electrode and the first shield pattern;
forming a switching active layer and a driving active layer on the gate insulating layer, the switching active layer and the driving active layer corresponding to the switching gate electrode and the driving gate electrode, respectively;
forming a switching source electrode and a switching drain electrode on the switching active layer, a driving source electrode and a driving drain electrode on the driving active layer, and a data line on the gate insulating layer, the data line crossing the gate line to define a pixel region;
forming a first passivation layer on the switching source electrode, the switching drain electrode, the driving source electrode, the driving drain electrode and the data line, the first passivation layer having a first contact hole exposing the driving drain electrode and a second contact hole exposing the switching drain electrode, the first contact hole disposed directly over the first shield pattern, the second contact hole of the first passivation layer disposed directly over the second shield pattern, wherein an exposed portion of the driving drain electrode through the first contact hole is removed;
forming a first electrode over the first passivation layer, the first electrode connected to the driving drain electrode through the first contact hole;
forming an organic electroluminescent layer on the first electrode; and
forming a second electrode on the organic electroluminescent layer.

16. The method according to claim 15, further comprising forming a first buffer pattern on the gate insulating layer over the first shield pattern and a second buffer pattern on the gate insulating layer over the second shield pattern.

17. The method according to claim 16, wherein the first and second buffer patterns are simultaneously formed with the switching and driving active layers.

18. The method according to claim 15, wherein the first passivation layer has a third contact hole exposing the driving gate electrode, further comprising forming a connection line on the first passivation layer, the connection line connected to the switching drain electrode through the second contact hole and to the driving gate electrode through the third contact hole.

19. The method according to claim 15, further comprising:
forming a detection gate electrode on the substrate;
forming a detection active layer on the gate insulating layer; and
forming a detection source electrode and a detection drain electrode on the detection active layer and a detection line on the gate insulating layer, the detection line parallel to and spaced apart from the data line.

20. The method according to claim 19, wherein the detection gate electrode, the detection source electrode and the detection drain electrode are connected to the gate line, the power line and the detection line, respectively.

21. The method according to claim 19, further comprising forming a gate extension line extending from the driving gate electrode on the substrate, wherein the first contact hole is disposed over the gate extension line and the first shield pattern include a portion of the gate extension line.

22. The method according to claim 15, wherein the driving source and drain electrodes have a finger shape.

23. The method according to claim 15, further comprising:
forming a color filter layer on the first passivation layer in the pixel region; and
forming a second passivation layer on the color filter layer, the first electrode formed on the second passivation layer.

* * * * *